United States Patent
Park et al.

(10) Patent No.: US 11,862,685 B2
(45) Date of Patent: Jan. 2, 2024

(54) WAFER AND METHOD OF MANUFACTURING WAFER

(71) Applicant: SENIC Inc., Cheonan-si (KR)

(72) Inventors: Jong Hwi Park, Cheonan-si (KR);
Kap-Ryeol Ku, Cheonan-si (KR);
Jung-Gyu Kim, Cheonan-si (KR);
Jung Woo Choi, Cheonan-si (KR);
Myung-Ok Kyun, Cheonan-si (KR)

(73) Assignee: SENIC INC., Cheonan-si (KR)

( * ) Notice: Subject to any disclaimer, the term of this patent is extended or adjusted under 35 U.S.C. 154(b) by 211 days.

(21) Appl. No.: 17/665,166

(22) Filed: Feb. 4, 2022

(65) Prior Publication Data

US 2022/0157944 A1 May 19, 2022

Related U.S. Application Data

(62) Division of application No. 17/355,663, filed on Jun. 23, 2021, now Pat. No. 11,289,576.

(30) Foreign Application Priority Data

Jul. 14, 2020 (KR) ................. 10-2020-0086798

(51) Int. Cl.
*H01L 21/16* (2006.01)
*H01L 29/16* (2006.01)
*G01N 23/207* (2018.01)
*H01L 21/02* (2006.01)
*H01L 21/66* (2006.01)

(52) U.S. Cl.
CPC ....... *H01L 29/1608* (2013.01); *G01N 23/207* (2013.01); *H01L 21/02529* (2013.01); *H01L 22/12* (2013.01)

(58) Field of Classification Search
CPC .......... H01L 29/1608; H01L 21/02529; H01L 22/12; G01N 23/207
See application file for complete search history.

(56) References Cited

U.S. PATENT DOCUMENTS

| | | | |
|---|---|---|---|
| 6,587,172 B1 * | 7/2003 | McKnight | G02F 1/133634 349/192 |
| 9,340,898 B2 | 5/2016 | Chen et al. | |

(Continued)

FOREIGN PATENT DOCUMENTS

| | | |
|---|---|---|
| JP | 4416040 B2 | 2/2010 |
| JP | 2010-514648 A | 5/2010 |

(Continued)

OTHER PUBLICATIONS

Korean Office Action dated Aug. 11, 2020 in counterpart Korean Patent Application No. 10-2020-0086798 (4 pages in English and 3 pages in Korean).

(Continued)

*Primary Examiner* — Victor A Mandala
*Assistant Examiner* — Colleen E Snow
(74) *Attorney, Agent, or Firm* — NSIP Law

(57) ABSTRACT

The wafer having a retardation distribution measured with a light having a wavelength of 520 nm, wherein an average value of the retardation is 38 nm or less, wherein the wafer comprises a micropipe, and wherein a density of the micropipe is 1.5/cm$^2$ or less, is disclosed.

8 Claims, 6 Drawing Sheets

(56) References Cited

U.S. PATENT DOCUMENTS

2016/0207783 A1* 7/2016 Hopkins ............. C04B 35/5603
2017/0321345 A1   11/2017 Xu et al.
2021/0272793 A1    9/2021 Park et al.

FOREIGN PATENT DOCUMENTS

| JP | 2013-67523 A | 4/2013 |
| JP | 5232719 B2 | 7/2013 |
| JP | 2013-245144 A | 12/2013 |
| JP | 2015-521378 A | 7/2015 |
| KR | 10-2010-0089103 A | 8/2010 |
| KR | 10-0983195 B1 | 9/2010 |
| KR | 10-2017-0076763 A | 7/2017 |
| KR | 10-2017-0127377 A | 11/2017 |
| KR | 10-2018-0044999 A | 5/2018 |
| KR | 10-2019-0054523 A | 5/2019 |
| KR | 10-2068933 B1 | 1/2020 |
| KR | 10-2104751 B1 | 4/2020 |
| WO | WO 2015/037465 A1 | 3/2015 |

OTHER PUBLICATIONS

Korean Notice of Allowance dated Nov. 6, 2020 in counterpart Korean Patent Application No. 10-2020-0086798 (2 pages in English and 2 pages in Korean).
Carbon solutions for high temperature applications; *CP-Handels-GmbH Graphitprodukte*; Mar. 29, 2013 (16 pages in German).

* cited by examiner

WAFER AND METHOD OF MANUFACTURING WAFER

CROSS-REFERENCE TO RELATED APPLICATIONS

This application is a divisional of U.S. patent application Ser. No. 17/355,663 filed Jun. 23, 2021, which claims priority to and the benefit of Korean Patent Applications No. 10-2020-0086798, filed on Jul. 14, 2020, the disclosures of which are incorporated herein by reference in their entireties.

BACKGROUND

1. Field

The present disclosure relates to a wafer and a method of manufacturing the wafer.

2. Description of Background

Silicon Carbide (SiC) is a semiconductor having a wide band gab of 2.2 eV to 3.3 eV, and the research and development for a SiC as a semiconductor material have been made due to its excellent physical and chemical properties.

As for methods of manufacturing a silicon carbide seed crystal, liquid phase epitaxy (LPE), chemical vapor deposition (CVD), and physical vapor transport (PVT) are known. Among them, physical vapor transport (PVT) is a method of charging a silicon carbide material inside a crucible, disposing a seed crystal consisting of silicon in upper side of the crucible, heating the crucible to sublimate the silicon carbide material by an induction heating method, and thereby growing a silicon carbide single crystal on the seed crystal.

Physical vapor transport (PVT) can manufacture a silicon carbide in an ingot shape with a high growth rate and thereby is currently the most widely used process. However, current density and temperature distribution inside the crucible change depending on properties of the crucible, the process condition, and so on, such that securing constant properties of a silicon carbide ingot and a wafer is difficult.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, the wafer may have a retardation distribution measured with a light having a wavelength of 520 nm, wherein an average value of the retardation is 38 nm or less, wherein the wafer includes a micropipe, and wherein a density of the micropipe is $1.5/cm^2$ or less.

In another general aspect, the wafer may have a retardation distribution measured with a light having a wavelength of 520 nm, wherein a maximum value of the retardation is 60 nm or less, wherein the wafer includes a micropipe, and wherein a density of the micropipe is $1.5/cm^2$ or less.

The wafer may include two sides opposite to each other, and an entire Ra average roughness of at least one of the two sides may be less than 0.3 nm.

The wafer may have a full width at half maximum (FWHM) value of 30 arcsec or less in a rocking curve according to XRD analysis.

The wafer may have a diameter of 4 inch or more, and may include a silicon carbide having a 4H structure.

In still another general aspect, the method of manufacturing a wafer includes: disposing a raw material and a silicon carbide seed crystal to face each other in an inner space of a reactor; adjusting a temperature, a pressure, and an atmosphere of the inner space to sublimate the raw material, thereby preparing a silicon carbide ingot grown from the seed crystal; cooling the reactor and retrieving the silicon carbide ingot; cutting the retrieved silicon carbide ingot, thereby preparing a wafer; and flattening a thickness of the prepared wafer and polishing a surface of the wafer, wherein the reactor includes an insulating material surrounding an external surface of the reactor and a heater for adjusting a temperature of the reactor or the temperature of the inner space, wherein a density of the insulating material is 0.14 g/cc to 0.28 g/cc and a coefficient of thermal expansion of the insulating material is $2.65 \times 10^{-6}/°C$. to $3.05 \times 10^{-6}/°C$., and wherein the prepared wafer may have a retardation distribution measured with a light having a wavelength of 520 nm, where an average value of the retardation is 38 nm or less or a maximum value of the retardation is 60 nm or less.

A flow of an inert gas may proceed in a direction from the raw material to the silicon carbide seed crystal while the silicon carbide ingot grows from the seed crystal, and a flow rate of the inert gas may be from 70 sccm to 300 sccm.

The polishing may include a chemical mechanical polishing.

The wafer after the flattening and the polishing may have a FWHM value of 30 arcsec or less in a rocking curve according to XRD analysis.

A porosity of the insulating material may be 72% to 95%.

A compressive strength of the insulating materials may be 0.2 MPa to 3 MPa.

The insulating material may include a graphite felt, a rayon-based graphite felt, a pitch-based graphite felt, or a mixture thereof.

The temperature and the pressure of the inner space may be adjusted to 2000° C. to 2600° C. and 1 torr to 200 torr, respectively.

The temperature of the inner space may reach to 2000° C. to 2600° C. at a heating rate of 1° C./min to 10° C./min by the heater during the preparing the silicon carbide ingot.

The temperature of the reactor may be cooled at a cooling rate of 1° C./min to 10° C./min during the cooling.

The silicon carbide ingot prepared from the method may comprise a first surface and a second surface opposite to the first surface, wherein the first surface is an upper portion of the silicon carbide ingot and is a flat surface or a convex surface.

The wafer prepared from the silicon carbide ingot may be prepared in a portion below the first surface, and wherein the wafer has a retardation distribution measured with a light having a wavelength of 520 nm and an average value of the retardation is 35 nm or less.

Other features and aspects will be apparent from the following detailed description and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
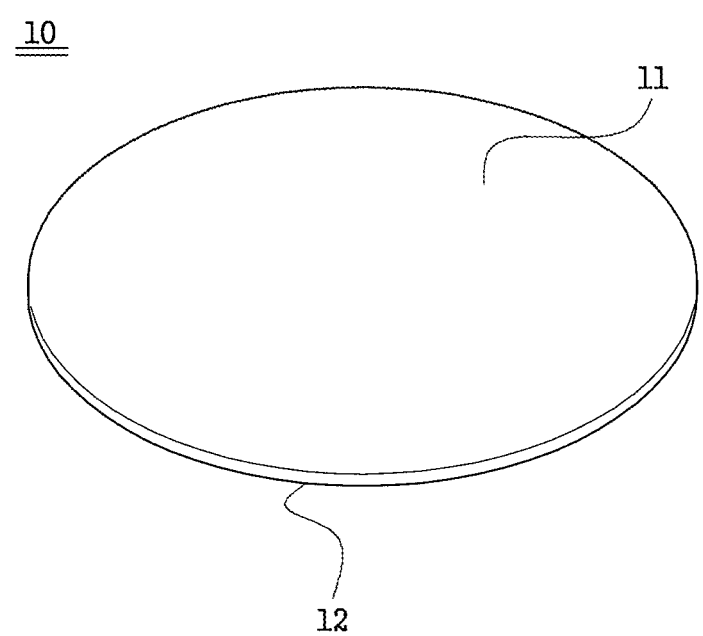
FIG. 1 is a conceptual view for an example of the wafer according to the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the present disclosure, the phrase that a certain element "comprises" or "includes" another element means that the certain element may further include one or more other elements but does not preclude the presence or addition of one or more other elements, unless stated to the contrary.

Throughout the present disclosure, it will be understood that when an element is referred to as being "connected" to another element, it can be directly connected to the other element or intervening elements may be present.

In this disclosure, "B being placed on A" means that B is placed in direct contact with A or placed over A with another layer or structure interposed therebetween and thus should not be interpreted as being limited to B being placed in direct contact with A, unless the description clearly dictates.

In this disclosure, the phrase "combination(s) thereof" included in a Markush-type expression denotes one or more mixtures or combinations selected from the group consisting of components stated in the Markush-type expression, that is, denotes that one or more components selected from the group consisting of the components are included.

In this disclosure, the description "A and/or B" means "A or B, or A and B."

In this disclosure, terms such as "first," "second," "A," or "B" are used to distinguish the same terms from each other.

The singular forms "a," "an," and "the" include the plural form unless the context clearly dictates otherwise.

In this disclosure, a singular form is contextually interpreted as including a plural form as well as a singular form unless specially stated otherwise.

Hereinafter, the present disclosure will be described in further detail.

One object of the present disclosure is to provide a silicon carbide ingot and a wafer having a low retardation in a polarized light during a visible light irradiation, by controlling a value such as a density of an insulating material during a manufacturing process of the silicon carbide ingot and the wafer.

Another object of the present disclosure is to provide a silicon carbide ingot and a wafer, whose defect value such as dislocation density is decreased and having excellent quality.

The wafer according to the present disclosure has advantages of having a low retardation value, not including distortion or twist of a crystal, and showing a good crystal quality.

Furthermore, the method of manufacturing the wafer according to the present disclosure can manufacture a silicon carbide ingot, which can secure a certain degree of retardation value, and whose defect density value is decreased, by applying an insulating material having certain density.

Various factors such as a raw material, an atmosphere, and a condition applied in a manufacturing process affect a quality of an ingot and a wafer obtained from the process. A crystal quality, a degree of defect occurrence, a residual stress, and so on of an ingot and a wafer can affect a performance, properties, and a manufacturing process of devices, which are manufactured into a wafer. Accordingly, though the crystal quality, the residual stress, and the defect may be evaluated as separate factors, they may also be comprehensively evaluated quantitatively by measuring retardation.

The inventors have conducted research on a method of manufacturing a silicon carbide ingot and a wafer having a better retardation distribution characteristic, reduced defects, and excellent crystal quality. The inventors have confirmed that among various factors, a temperature gradation and properties of an insulating material is important in growth of a silicon carbide when applying a physical vapor transport (PVT), and a silicon carbide ingot and a wafer with an excellent quality can be manufactured by controlling these conditions, and thus completed this invention.

Wafer 10

In one general aspect, the wafer 10 according to the present disclosure may have a retardation distribution measured with a light having a wavelength of 520 nm, and an average value of the retardation is 38 nm or less.

The wafer 10 may have the average value of retardation measured with a light having a center wavelength of 520 nm entering the wafer in a thickness direction, and the average value of the retardation may be 38 nm or less.

Referring to FIG. 1, the wafer 10 may include one side 11 and the other side 12, which are opposite to each other.

The thickness direction may be a direction from the one side 11 to the other side 12.

The one side 11 of the wafer 10 is so-called Si surface, where silicon atoms mainly distributed on the surface, and the other side 12 as an opposite side of the one side 11 is so-called C surface, where carbon atoms mainly distributed on the surface.

When cutting the wafer 10, the wafer 10 may be easily cut in an interface between the layer of carbon atoms and the layer of silicon atoms, or in a direction parallel to the interface. Accordingly, a surface, where carbon atoms are mainly exposed, and another surface, where silicon atoms are mainly exposed, tend to exist on the cross section.

Polishing of one side and/or the other side of a wafer may be performed during a process of manufacturing a wafer from an ingot. The wafer used for measuring retardation distribution may be a wafer, where both of the surfaces of the wafer are polished.

Retardation distribution within a certain area may be measured by being visualized or quantified through a device such as WPA-200 or WPA-micro available from PHOTONIC LATTICE, INC. Example embodiments are based on the results measured with a light having a wavelength of 520 nm by applying WPA-200 available from PHOTONIC LATTICE, INC.

The retardation refers to a value showing a difference of phases between before and after transmitting a polarized visible ray in a thickness direction of a target. When the target has residual stress, distortion, defects, or damage, variation occurs in the retardation distribution.

Even though in a clear target not having a birefringence characteristic, the birefringence may be observed when a certain stress and distortion are applied to the target. Accordingly, evaluating a birefringence is one convenient method for evaluating residual stress and distortion quantitatively.

Retardation distribution is a parameter related to a phase retardation value of a target, which may be generated when polarized light is transmitted through the target in a thickness direction thereof. Occurrence of a phase difference means that a polarized state is changed. Additionally, the phase difference may be generated by various causes.

Birefringence is generally in proportion to retardation, such that retardation can be used as a parameter showing a degree of residual stress. Accordingly, when retardation distribution is within a certain range in an entire area, it means that the target has a stress regulated in the area. Particularly, when a target is formed with the substantially same material in a thickness direction, and the thickness of the target is substantially equal, the result can be more credible.

However, retardation distribution may be affected by other factors besides residual stress. For example, retardation distribution may be changed by defects such as distortion and dislocation, and may also be affected by a degree of crystallinity in a case of a crystalline substance. Also, retardation distribution may be changed by defects such as a fine crack generated in a target.

That is, evaluation of retardation distribution of a wafer may be considered to be a method for simultaneously evaluating a degree of residual stress, a presence of distortion and defects, excellence of crystal, presence of existing damage or a possible damage from an external impact, and may be used as a criteria for confirming whether various characteristics required for the wafer manufactured by the present disclosure are all excellent.

The average value of the retardation of the wafer 10 may be 38 nm or less. The average value of the retardation of the wafer may be 30 nm or less, or 20 nm or less. The average value of the retardation of the wafer may be 15 nm or less. The average value of the retardation of the wafer may be 0.1 nm or more. The average value of the retardation of the wafer may be 5 nm or more. When the wafer has such a retardation value, distortion or defects of the inner crystal can be minimized, and the wafer has improved properties when applied as a semiconductor device.

The maximum value of the retardation of the wafer 10 may be 60 nm or less, 45 nm or less, or 42.8 nm or less.

The minimum value of the retardation of the wafer 10 may be less than 0.10 mm, 0.08 mm or less, or 0.02 mm or less.

The standard deviation of the retardation of the wafer 10 in the direction of the thickness of the wafer may be 30 nm or less, 20 nm or less, or 12 nm or less. The deviation of retardation may be 1 nm or more.

When the wafer has these maximum, minimum, and standard deviation of retardation, an inner lattice of the wafer has minimum distortion or defects, and the wafer can have constant distribution of the inner lattice.

The wafer 10 may be prepared by cutting a silicon carbide ingot as described below.

The wafer may have a rocking angle of $-1.5°$ to $1.5°$, $-1.0°$ to $1.0°$, $-0.5°$ to $0.5°$, or $-0.3°$ to $0.3°$. The wafer having such a characteristic can have an excellent crystalline characteristic. The rocking angle may be measured by a high-resolution X-ray diffraction analysis system (HR-XRD system) according to the following method. The [11-20] direction of the wafer is set to an X-ray route, the angles of X-ray source optic and X-ray detector optic are set to 2 θ (35° to 36°), omega (ω, or θ as an X-ray detector optic) angle is set to an off angle of the wafer to measure a rocking curve, and a differences between a peak angle as a reference angle and two full width at half maximum (FWHM) values are respectively set as the rocking angles to evaluate crystallinity.

In the present disclosure, off angle is X° means having an off angle evaluated as X° within the margin of error generally permitted, and for example, includes an off angle in a range of (X°−0.05°) to (X°+0.05°). In addition, "a rocking angle is −1° to 1° compared to a reference angle" means that a full width at half maximum value is within a range of (peak angle−1°) to (peak angle+1°) based on the peak angle as a reference angle. Moreover, for the rocking angle, a surface except for a center and portions within 5 mm from the edges to the center are trisected to be substantially equal, and the results of measuring three times or more in respective portions were averaged to be considered as the above rocking angle. In detail, among wafers applied with an off angle, which is an angle selected in a range of 0° to 10° against (0001) surface of a silicon carbide ingot, when the off angle is 0°, the omega angle is 17.8111°, when the off angle is 4°, the omega angle is 13.811°, and when the off angle is 8°, the omega angle is 9.8111°.

The wafer 10 may have a full width at half maximum value (FWHM) of rocking curve of 30 arcsec or less, or 27.4 arcsec or less according to XRD analysis. The wafer 10 may have FWHM of rocking curve of 3.5 arcsec or more according to XRD analysis. When a defect is present in a crystal of a wafer, a strength of a diffracting X-Ray shows gaussian distribution and this is referred to as a rocking curve. The FWHM of a rocking curve has a unit of arcsec, and when the FWHM is large, it may be considered as having many crystal defects. The wafer having above ranges of the FWHM may exhibit excellent crystallinity and improve properties of devices manufactured from the same.

The wafer 10 may have a micropipe (MP) density of $1.5/cm^2$ or less, or $1/cm^2$ or less.

The wafer 10 may have a threading edge dislocation (TED) density of $10,000/cm^2$ or less, or $8,000/cm^2$.

The wafer 10 may have a basal plane dislocation (BPD) density of $5,000/cm^2$ or less, or $3,000/cm^2$ or less.

The thickness of the wafer 10 may be 150 μm to 900 μm, or 200 μm to 600 μm, but not limited thereto, and any proper thickness applicable to a semiconductor device can be applied.

The wafer 10 may be a silicon carbide wafer, and may be a wafer substantially including a 4H silicon carbide, which is a single crystal.

The diameter of the wafer 10 may be 4 inch or more, 5 inch or more, or 6 inch or more. The diameter of the wafer may be 12 inch or less, or 10 inch or less.

The entire Ra average roughness of one side 11 of the wafer 10 may be less than 0.3 nm, or 0.2 nm or less. The entire Ra average roughness of the one side 11 may be 0.01 nm or more. A wafer having these ranges of roughness can improve electric properties, when manufactured into a device through subsequent processes.

The wafer 10 may be manufactured by the method of manufacturing the wafer described below.

Method of Manufacturing the Wafer

In another general aspect, the method of manufacturing the wafer according to example embodiments includes, a preparation step of disposing a raw material 300 and a silicon carbide seed crystal to face each other in an inner space of a reactor 200; a growing step of adjusting a temperature, a pressure, and an atmosphere of the inner space to sublimate the raw material, and thereby preparing a silicon carbide ingot grown from the seed crystal; a cooling step of cooling the reactor 200 and retrieving the silicon carbide ingot; a cutting step of cutting the retrieved silicon carbide ingot thereby preparing a wafer; and a processing step of flattening a thickness of the prepared wafer and polishing a surface of the wafer, wherein the reactor includes an insulating material surrounding an external surface of the reactor 200 and a heater for adjusting a temperature of the reactor or the temperature of the inner space, and a density of the insulating material is 0.14 g/cc to 0.28 g/cc.

The preparation step is for disposing the raw material 300 and the silicon carbide seed crystal to face each other in the reactor 200 having the inner space.

The silicon carbide seed crystal in the preparation step may be one with a proper size depending on a desired wafer, and a C surface ((000-1) surface) of the silicon carbide seed crystal can be toward a direction of the raw material 300.

The raw material 300 in the preparation step may be a powder form having carbon sources and silicon sources, and the powder may be a material treated by necking from each other or a silicon carbide powder, whose surface is treated with carbonization.

The reactor 200 in the preparation step may be any container, which is proper for growing reaction of a silicon carbide ingot, and for example, a graphite crucible may be applied. Specifically, the reactor 200 may include a body 210 including an inner space and an opening part, and a cover 220 corresponding the opening part and thereby closing the inner space. The crucible cover may further comprise a seed crystal holder in one body or separated with the crucible cover, and can fix a silicon carbide seed crystal to allow a silicon carbide seed crystal and a material to face each other through the seed crystal holder.

The reactor 200 in the preparation step may be surrounded and fixed by an insulating material 400, the insulating material 400 surrounding the reactor may be placed inside a reaction chamber 500 like a quartz tube, and the temperature of the inner space of the reactor 200 may be controlled by a heater 600 disposed outside of the insulating material 400 and the reaction chamber 200.

The insulating material 400 in the preparation step may have a coefficient of thermal expansion of $2.65 \times 10^{-6}/°C$ to $3.05 \times 10^{-6}/°C$, $2.7 \times 10^{-6}/°C$ to $3 \times 10^{-6}/°C$, or $2.75 \times 10^{-6}/°C$ to $2.9 \times 10^{-6}/°C$ at 1000° C. The coefficient of thermal expansion may be an average of coefficients of thermal expansion in a first direction, which is one direction of the insulating material, a second direction perpendicular to the first direction, and a third direction perpendicular to the first direction and the second direction. By applying an insulating material having such a coefficient of thermal expansion, a proper distribution of residual stress can be obtained through establishing even distribution of temperature gradient, and retardation distribution measured with a visible ray in a thickness direction of the wafer can have a good value.

The coefficient of thermal expansion can be obtained by measuring length variation depending on a unit temperature. In detail, it can be obtained by cutting the insulating material as a measuring target in a size of $5 \times 5 \times 5$ mm$^3$ for preparing a measuring sample, and measuring length variation against the unit temperature by using TMA Q400 available from TA INSTRUMENTS INC, and the coefficient of thermal expansion may be a value at 1000° C.

The insulating material 400 in the preparation step may have a porosity of 72% to 95%, 75% to 93%, or 80% to 91%. When applying the insulating material satisfying the above porosity, it is possible to decrease crack occurrence of the silicon carbide ingot to be grown.

The insulating material 400 in the preparation step may have a compressive strength of 0.2 MPa or more, 0.48 MPa or more, or 0.8 MPa or more. Also, the insulating material 400 may have a compressive strength of 3 MPa or less, or 2.5 MPa or less. When the insulating material has such a compressive strength, it is possible to manufacture a silicon carbide ingot excellent in thermal/mechanical stability and having a more excellent quality due to a decreased possibility of generating ash.

The insulating material 400 in the preparation step may include a carbon-based felt, and in detail, may include a graphite felt, a rayon-based graphite felt, or a pitch-based graphite felt.

The insulating material 400 in the preparation step may have a density of 0.14 g/cc or more, 0.16 g/cc or more, or 0.17 g/cc or more. The insulating material may have a density of 0.28 g/cc or less, 0.24 g/cc or less, or 0.20 g/cc or less. With the insulating material having the above density ranges, a bend and a twist can be prevented in an ingot to be manufactured, and a good retardation value can be obtained in a wafer manufactured from the ingot.

The reaction chamber 500 in the preparation step may include a vacuum exhauster 700 connected to the internal space of the reaction chamber 500, which regulates a vacuum degree of the internal space of the reaction chamber 500, a pipe 810 connected to the internal of the reaction chamber 500 and allowing an inert gas to flow into the internal space of the reaction chamber 500, and a mass flow controller 800 for controlling the flow of the inert gas. Through them, the flow rate of an inert gas can be regulated in subsequent growing step or cooling step.

The growing step is for adjusting the temperature, the pressure, and the air atmosphere of the inner space of the reactor 200 to sublime the raw material and thereby preparing a silicon carbide ingot grown from the seed crystal.

The growing step can proceed by the heater 600 heating the reactor 200 and the inner space of the reactor 200, and can induce growing of a silicon carbide crystal by depressurizing the inner space simultaneously or separately from the heating to adjust a vacuum degree of the inner space and by introducing an inert gas into the inner space.

The growing step may proceed in a condition of a temperature of 2000° C. to 2600° C. and a pressure of 1 torr to 200 torr, and it is possible to manufacture a silicon carbide ingot more efficiently in the above ranges of temperature and pressure.

In detail, the growing step may proceed in a condition, in which temperatures at surfaces of an upper and a lower portions of the reactor 200 are 2100° C. to 2500° C., and a pressure of the inner space of the reactor 200 is 1 torr to 50 torr, and in further detail, in a condition in which the temperatures at the surfaces of the upper and the lower portion of the reactor 200 are 2150° C. to 2450° C., and a pressure of the inner space of the reactor 200 is 1 torr to 40 torr, and more specifically, in a condition, in which the temperatures at the surfaces of the upper and the lower portion of the reactor 200 are 2150° C. to 2350° C., and the pressure of the inner space of the reactor 200 is 1 torr to 30 torr.

When the condition of temperature and pressure above is applied to the growing step, a silicon carbide ingot in a higher quality can be manufactured.

The growing step may allow heating to proceed at a heating rate of 1° C./min to 10° C./min, or 5° C./min to 10° C./min until reaching the above temperature range.

In the growing step, an inert gas may be added in a fixed flow rate to an outside of the reactor 200. The inert gas may flow in the inner space of the reactor 200, and may flow in a direction from the raw material 300 to the silicon carbide seed crystal. Accordingly, a stable temperature gradient can be formed in the reactor 200 and the inner space of the reactor 200.

The flow rate of the inert gas in the growing step may be 70 sccm or more, or 330 sccm or less. In this range for the flow rate of the inert gas, defect occurrence of the ingot manufactured can be minimized, and a desired retardation value can be achieved by forming effective temperature gradient of the reactor and the inner space.

Specifically, the inert gas in the growing step may be an argon, a helium, or a mixture thereof.

The cooling step is for cooling the grown silicon carbide ingot at a specific cooling rate and a flow rate of the inert gas.

The cooling step may allow cooling to proceed in a rate of 1° C./min to 10° C./min, or 1° C./min to 5° C./min.

The cooling step may simultaneously regulate the pressure of the inner space of the reactor 200, or the pressure may be regulated separately from the cooling step. The pressure may be regulated to have maximum 760 torr for the inner space.

The flow rate of the inert gas in the cooling step may be 1 sccm or more, or 300 sccm or less. Crack occurrence can be prevented, and the quality degradation can be minimized in an ingot manufactured in this range of the flow rate.

In the cooling step, an inert gas may be added in a fixed flow rate to the outside of the reactor 200 like in the growing step. The inert gas may flow in the inner space of the reactor 200, and may flow in a direction from the raw material 300 to the silicon carbide seed crystal.

The cutting step is for cutting the silicon carbide ingot retrieved after the cooling step and thereby preparing a wafer.

Through the cutting step, the silicon carbide ingot can be cut in a fixed off angle with the (0001) surface of the silicon carbide ingot or a surface, where growing has started in the silicon carbide ingot. The off angle in the cutting step may be 0° to 10°.

The cutting step may allow the thickness of the wafer to be 150 μm to 900 μm, or 200 μm to 600 μm, but the present disclosure is not limited thereto.

The processing step is for flattening the thickness of the wafer prepared through the cutting step and polishing the surface of the wafer. The process for flattening the thickness may be accomplished by applying wheel grinding to both sides of the wafer one by one. A polishing material used for the wheel grinding may be a diamond polishing material.

Through the process of flattening the thickness in the processing step, damage and stress added to the wafer in the cutting step are reduced and the wafer is made to be flat.

The process of polishing the surfaces in the processing step may further include a chemical mechanical polishing (CMP).

The chemical mechanical polishing process may be performed by adding slurry of polished particles on a rotating plate and contacting the fixed wafer with a rotating polishing head at a certain pressure.

A washing step using a general RCA chemical washing solution may be further performed after the processing step.

Silicon Carbide Ingot 100

In still another general aspect, the silicon carbide ingot 100 according to the present disclosure may include, a first surface 110 and a second surface 120 opposite to the first surface, wherein the first surface is defined as an upper portion of the silicon carbide ingot and may be a flat surface or a convex surface, wherein a wafer may be prepared in a portion below the first surface, and wherein the wafer may have retardation distribution measured with a light having a wavelength of 520 nm and an average value of the retardation may be 35 nm or less.

The silicon carbide ingot 100 is grown from a raw material inside a reactor, which is sublimed and recrystallized on a silicon carbide seed crystal.

Figure 3:
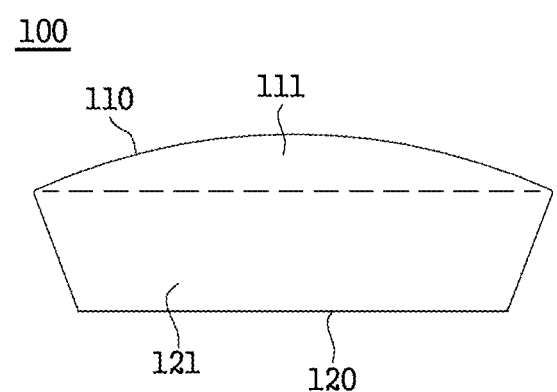
FIG. 3 is a conceptual view for an example of the silicon carbide ingot according to the present disclosure.
Figure 4A:
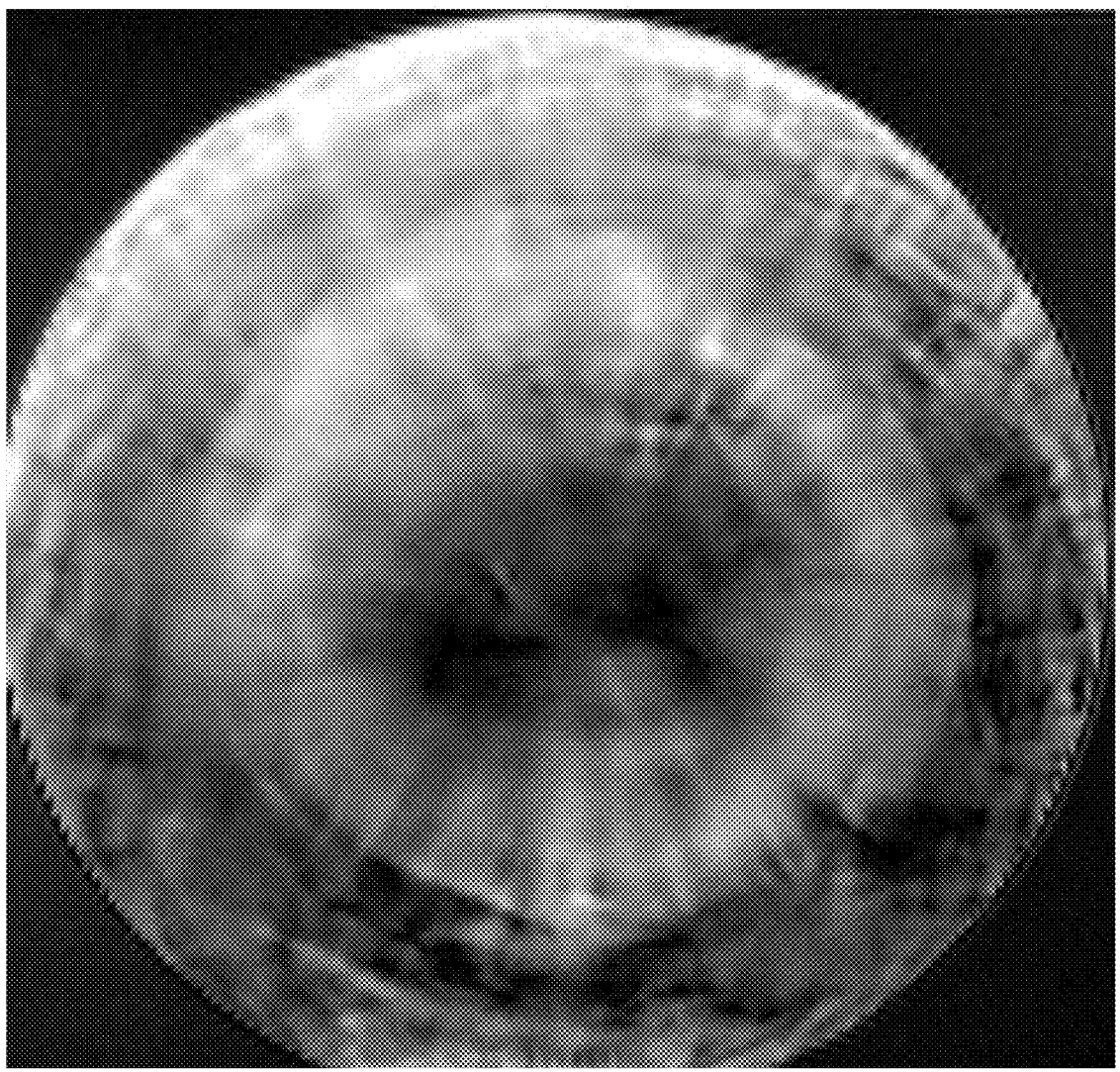
FIGS. 4A to 4C are photos showing the measured results of retardation for Example 2, Example 3, and Comparative Example 1 (GREY and auto-scale is applied for a color display, 4A is the result of applying a scale of black: 0.0 and white: 20.0, 4B is the result of applying a scale of black: 0.0 and white: 30.0, and 4C is the result of applying a scale of black: 0.0 and white: 40.0).
Figure 4B:
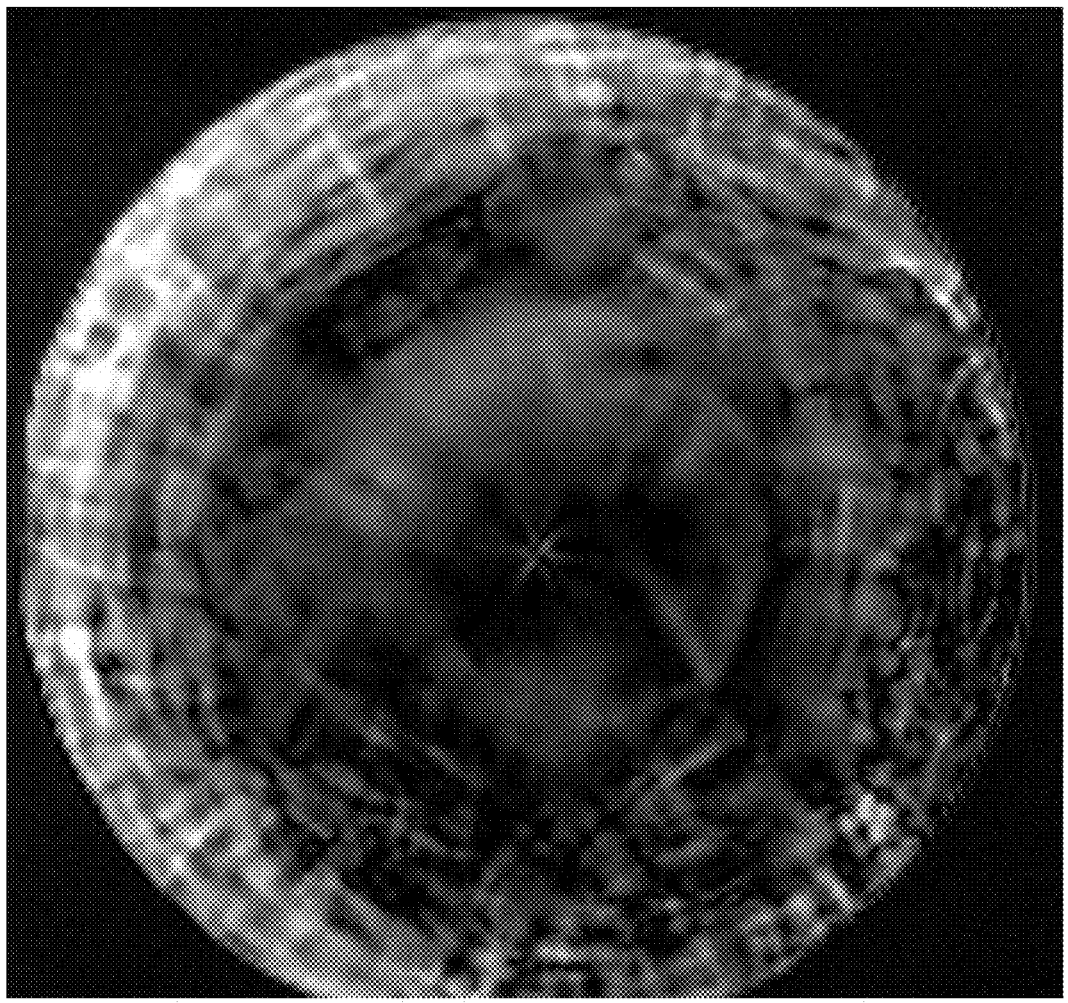
Figure 4C:
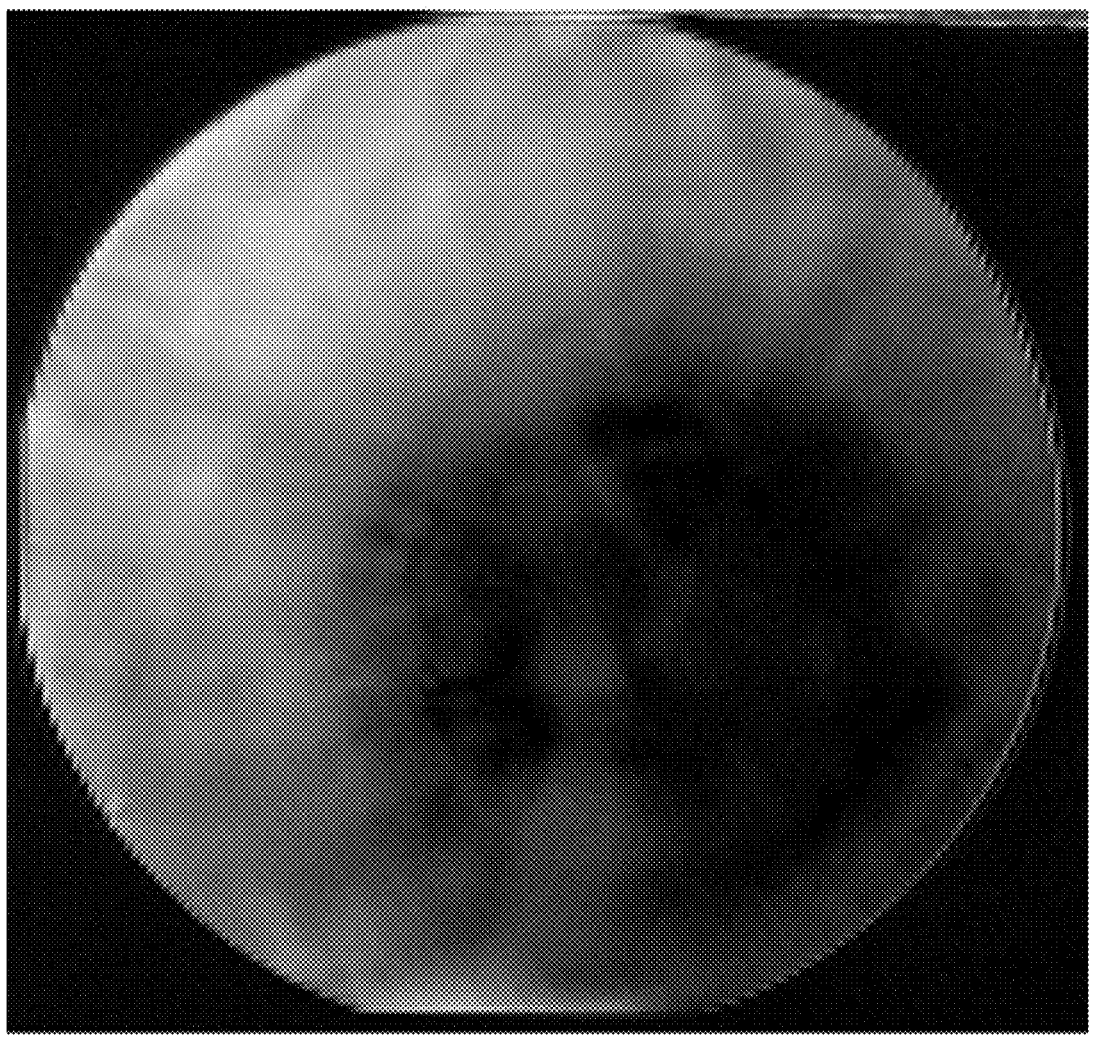

Referring to FIG. 3, a surface facing the raw material among surfaces of the silicon carbide ingot after being completion of the growing may be the first surface 110, and the first surface 110 may have a curved convex surface or a flat surface.

The silicon carbide ingot 100 may include a body 121 and a convex part 111 extended from the body and having a convex surface. When the convex surface of the silicon carbide ingot is designated as an upper portion, a portion below the convex surface may correspond to the body.

That is, when the first surface 110 of the silicon carbide ingot is designated as an upper portion, a bottom surface, where the growing of the silicon carbide ingot has started, may be designated as the second surface 120 and be designated as a lower portion, and a portion below the first surface may be cut in a fixed thickness to prepare a wafer. At this time, a certain off angle may be applied with the second surface 120 or (0001) surface of the silicon carbide ingot.

In addition, the process of preparing the wafer may include, trimming an outer diameter of the silicon carbide ingot 100 in a direction from the outer diameter to an inner diameter using a grinding device, cutting the silicon carbide ingot in a certain thickness and with a fixed off angle against the second surface 120 or (0001) surface of the silicon carbide ingot, grinding the edges, grinding the surface, and a processing such as polishing.

The silicon carbide ingot 100 may be grown from a C surface ((000-1) surface) of a silicon carbide seed crystal.

The silicon carbide ingot 100 may be manufactured through a crucible satisfying a certain thermal conductivity in a growing step and a cooling step during the manufacture.

Hereinafter, the present disclosure will be described in further detail by specific embodiments. The below embodiments are for illustration only and the scope of the present application is not limited thereto.

Example 1—Manufacture of Wafer

Figure 2:
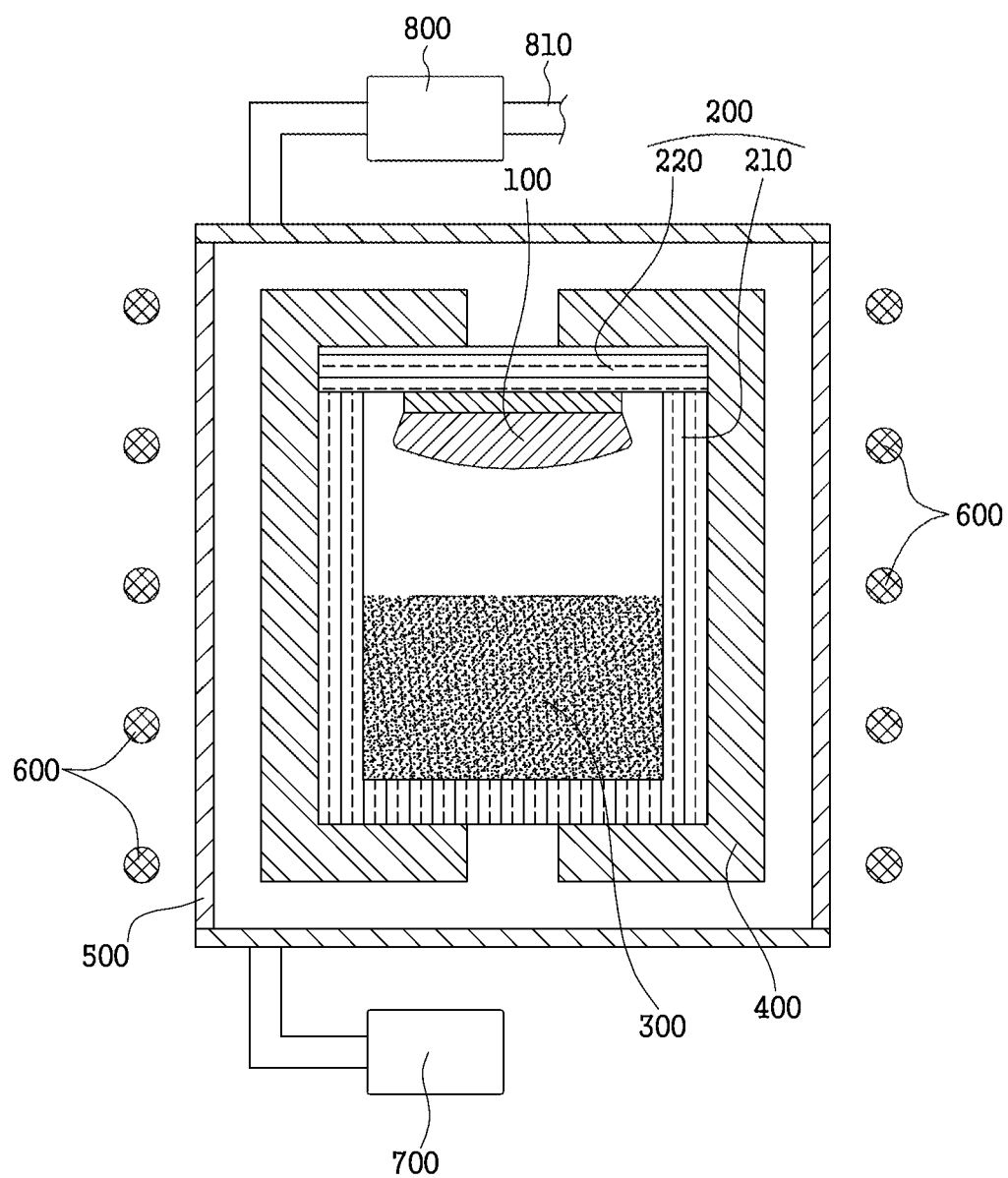
FIG. 2 is a conceptual view for an example of the manufacturing device of the silicon carbide ingot according to the present disclosure.

As being illustrated in FIG. 2, a silicon carbide powder as a material was charged in a lower portion of an inner space of a reactor 200, and a silicon carbide seed crystal was disposed in an upper portion thereof. At this time, a silicon carbide seed crystal consisting of a 4H—SiC crystal with 6 inch was used, and C surface ((000-1) surface) of the silicon carbide seed crystal was faced toward the silicon carbide raw material in a lower portion of the inner space using a conventional method. Similar process was applied to the examples and the comparative examples described below.

A reactor 200 was sealed up, the outside thereof was surrounded with an insulating material 400 having a density of 0.15 g/cc and a coefficient of thermal expansion of $2.80 \times 10^{-6}/°$ C., and after that the reactor was disposed inside a quartz tube 500, which is equipped with a heating coil as the heater 600 at the outside of the quartz tube 500. The inner space of the reactor 200 was depressurized to a vacuum atmosphere, argon gas was introduced to the inner space to reach 760 torr, and the inner space was depressurized again. At the same time, the temperature of the inner space was heated to 2300° C. at a heating rate of 5° C./min, and the flow rate of argon gas inside a quartz tube was adjusted through a pipe and a vacuum degassing device 700 connected to the quartz tube 500. A silicon carbide ingot was allowed to be grown on a surface of a silicon carbide seed crystal opposite to a silicon carbide raw material for 100 hours under a temperature of 2300° C. and a pressure of 20 torr.

After growing of the silicon carbide ingot, the temperature of the inner space was cooled to 25° C. at a rate of 5° C./min, and at the same time, the pressure of the inner space was set to be 760 torr.

A wafer sample, which was cut to have an off angle of 4° against (0001) surface of the cooled silicon carbide ingot and had a thickness of 360 μm, was prepared, the edge of this wafer was ground by 5% against the maximum outer diameter, and subsequently chemical mechanical polishing and RCA washing was performed.

Example 2—Manufacture of Wafer

A wafer was manufactured by the same method as the Example 1, except that the density of the insulating material was 0.16 g/cc and the coefficient of thermal expansion was $2.75 \times 10^{-6}/°$ C.

Example 3—Manufacture of Wafer

A wafer was manufactured by the same method as the Example 1, except that the density of the insulating material was 0.17 g/cc and the coefficient of thermal expansion was $2.9 \times 10^{-6}/°$ C.

Comparative Example 1—Manufacture of Wafer

A wafer was manufactured by the same method as the Example 1, except that the density of the insulating material was 0.13 g/cc and the coefficient of thermal expansion was $2.6 \times 10^{-6}/°$ C.

Comparative Example 2—Manufacture of Wafer

A wafer was manufactured by the same method as the Example 1, except that the density of the insulating material was 0.29 g/cc and the coefficient of thermal expansion was $3.1 \times 10^{-6}/°$ C.

Experimental Example—Measurement of Retardation and the Full Width at Half Maximum Value of Wafer The prepared wafer samples were measured for the average value, the minimum value, and the maximum value of retardation in a thickness direction of a wafer by using WPA-200 device (available from PHOTONIC LATTICE, INC) with a light having wavelength of 520 nm, and the results were shown in Table 1 and Table 4. And then, the FWHMs of the rocking curve of the wafer samples were measured through a XRD analyzing device (SmartLab X-ray Diffractometer available from RIGAKU), and the results were shown in Table 1.

TABLE 1

| | Density of Insulating Material (g/cc) | Coefficient of Thermal Expansion ($\times 10^{-6}$)/° C. (@1000° C.) | The Average of Retardation (nm) | The Minimum Value of Retardation (nm) | The Maximum Value of Retardation (nm) | The Average of the Full Width at Half Maximum Value (arcsec) |
|---|---|---|---|---|---|---|
| Example 1 | 0.15 | 2.80 | 20 | 0.01 | 25.06 | — |
| Example 2 | 0.16 | 2.75 | 19 | 0.08 | 42.74 | 27.4 |
| Example 3 | 0.17 | 2.9 | 15 | 0.02 | 42.72 | 26.7 |
| Comparative Example 1 | 0.13 | 2.6 | 40 | 0.12 | 69.27 | 65.3 |
| Comparative Example 2 | 0.29 | 3.1 | 41 | 0.10 | 80.66 | — |

Referring to Table 1, it was confirmed that the Examples having the density of the insulating material within a range of 0.14 g/cc to 0.28 g/cc, and the coefficient of thermal expansion within a range of $2.65 \times 10^{-6}/°$ C. to $3.05 \times 10^{-6}/°$ C. had a retardation value of 35 nm or less and the FWHM of the X-Ray rocking curve of 30 arcsec or less, such that the Examples show excellent crystal quality, whose residual stress distribution was good and whose distortion occurrence, defects, and so on were reduced, compared to the Comparative examples having a density of insulating material and a coefficient of thermal expansion outside these ranges.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wafer having a retardation distribution measured with a light having a wavelength of 520 nm,
    wherein an average value of the retardation is 38 nm or less,
    wherein the wafer comprises a micropipe, and
    wherein a density of the micropipe is $1.5/cm^2$ or less.

2. The wafer of claim 1 comprising two sides opposite to each other, and an entire Ra average roughness of at least one of the two sides may be less than 0.3 nm.

3. The wafer of claim 1, wherein the wafer has a full width at half maximum (FWHM) value of 30 arcsec or less in a rocking curve according to XRD analysis.

4. The wafer of claim 1, wherein the wafer has a diameter of 4 inches or more, and comprises a silicon carbide having 4H structure.

5. A wafer having a retardation distribution measured with a light having a wavelength of 520 nm,
    wherein a maximum value of the retardation is 60 nm or less,
    wherein the wafer comprises a micropipe, and
    wherein a density of the micropipe is $1.5/cm^2$ or less.

6. The wafer of claim 5 comprising two sides opposite to each other, and an entire Ra average roughness of at least one of the two sides may be less than 0.3 nm.

7. The wafer of claim 5, wherein the wafer has a full width at half maximum (FWHM) value of 30 arcsec or less in a rocking curve according to XRD analysis.

8. The wafer of claim 5, wherein the wafer has a diameter of 4 inches or more, and comprises a silicon carbide having 4H structure.

* * * * *